United States Patent
Jang et al.

(10) Patent No.: US 7,818,526 B2
(45) Date of Patent: Oct. 19, 2010

(54) SEMICONDUCTOR MEMORY DEVICE HAVING TEST MODE FOR DATA ACCESS TIME

(75) Inventors: Ji-Eun Jang, Ichon-shi (KR); Kee-Teok Park, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 284 days.

(21) Appl. No.: 11/022,828

(22) Filed: Dec. 28, 2004

(65) Prior Publication Data

US 2005/0185484 A1    Aug. 25, 2005

(30) Foreign Application Priority Data

Feb. 19, 2004    (KR) .................... 10-2004-0011094

(51) Int. Cl.
    *G06F 12/00* (2006.01)
    *G06F 13/00* (2006.01)
    *G06F 13/28* (2006.01)
    *G11C 29/00* (2006.01)
    *G11C 7/00* (2006.01)

(52) U.S. Cl. ................. 711/167; 365/201; 711/E12.001
(58) Field of Classification Search .................. 365/201
See application file for complete search history.

(56) References Cited

U.S. PATENT DOCUMENTS

| | | | | |
|---|---|---|---|---|
| 5,311,473 A | * | 5/1994 | McClure et al. | 365/201 |
| 5,361,230 A | * | 11/1994 | Ikeda et al. | 365/194 |
| 5,428,622 A | * | 6/1995 | Kuban et al. | 714/729 |
| 5,548,560 A | * | 8/1996 | Stephens et al. | 365/233.5 |
| 5,721,740 A | * | 2/1998 | Moon et al. | 714/731 |
| 5,825,691 A | * | 10/1998 | McClure | 365/189.16 |
| 5,864,696 A | * | 1/1999 | McClure | 714/731 |
| 6,006,339 A | * | 12/1999 | McClure | 713/500 |
| 6,111,800 A | * | 8/2000 | Allan et al. | 365/201 |
| 6,125,421 A | * | 9/2000 | Roy | 711/5 |
| 6,353,565 B2 | * | 3/2002 | Ito | 365/201 |
| 6,479,363 B1 | * | 11/2002 | Tanimura | 438/384 |
| 6,530,040 B1 | * | 3/2003 | Gradinariu et al. | 714/42 |

(Continued)

FOREIGN PATENT DOCUMENTS

JP        06-075022        3/1994

(Continued)

*Primary Examiner*—Matt Kim
*Assistant Examiner*—Matthew R Chrzanowski
(74) *Attorney, Agent, or Firm*—IP & T Law Firm PLC (57) ABSTRACT

A semiconductor memory device for measuring a data access time by controlling data output operation, including: a pipe latch control unit for generating an input control signal based on a test mode signal; a pipe latch unit for receiving data and controlling the data according to a CAS latency in synchronization with a clock signal at a normal mode or passing the data without synchronization with the clock signal at a test mode based on the input control signal; an output control unit for generating an output node control signal based on the test mode signal; and an output unit for controlling an output data outputted from the pipe latch means according to the CAS latency in synchronization with the clock signal at the normal mode or passing the output data without synchronization with the clock signal at the test mode based on the output node control signal.

16 Claims, 6 Drawing Sheets

U.S. PATENT DOCUMENTS

| | | | |
|---|---|---|---|
| 6,662,315 B1 * | 12/2003 | Gradinariu et al. | 714/42 |
| 6,813,203 B2 * | 11/2004 | Nakagawa | 365/201 |
| 6,853,317 B2 * | 2/2005 | Kim et al. | 341/50 |
| 2001/0020747 A1 * | 9/2001 | Eldridge et al. | 257/779 |
| 2004/0004216 A1 * | 1/2004 | Eldridge et al. | 257/48 |
| 2004/0081012 A1 * | 4/2004 | Setogawa | 365/233 |

FOREIGN PATENT DOCUMENTS

| | | |
|---|---|---|
| JP | 06-088862 | 3/1994 |
| JP | 07-248356 | 9/1995 |
| JP | 2000-173295 A | 6/2000 |
| JP | 2000-182399 | 6/2000 |

* cited by examiner

SEMICONDUCTOR MEMORY DEVICE HAVING TEST MODE FOR DATA ACCESS TIME

FIELD OF INVENTION

The present invention relates to a semiconductor memory device; and, more particularly, to a semiconductor memory device having a test mode for data access time.

DESCRIPTION OF PRIOR ART

Generally, if a read command is inputted to a dynamic random access memory (DRAM), a data according to the read command is outputted through a data output pad. Herein, a minimum delay time from a timing of inputting the read command to a timing of outputting the data through the data output pad is called a data access time. In other words, the data access time is called an address access delay time (tAA) according to a specification of the DRAM.

Figure 1:
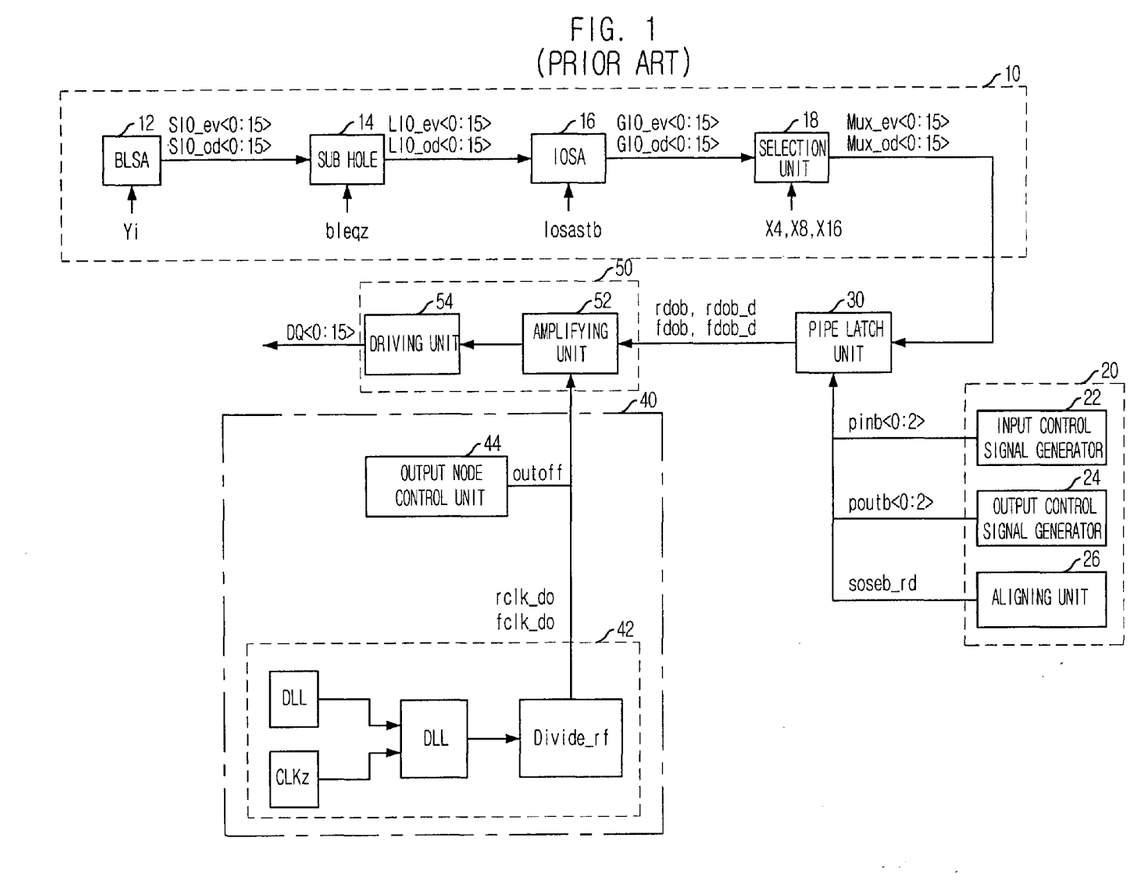
FIG. 1 is a block diagram showing a data read path of a conventional semiconductor memory device.

FIG. 1 is a block diagram showing a data read path of a conventional semiconductor memory device.

As shown, the conventional semiconductor memory device includes a pipe latch unit 30, a pipe latch control unit 20, an output unit 50 and an output control unit 40.

The pipe latch unit 30 receives a first and a second data Mux_ev<0:15> and Mux_od<0:15>. The pipe latch control unit 40 controls a data input/output operation of the pipe latch unit 30 according to a column address strobe (CAS) latency and a clock signal. The output unit 50 receives rising output data rdob and rdob_d and falling output data fdob and fdob_d outputted from the pipe latch unit 30 and outputs the received rising output data and the falling output data to data output pin DQ<0:15>. The output control unit 40 controls the data input/output operation of the output unit 40 according to the clock signal.

The pipe latch control unit 20 includes an input control signal generator 22, an output control signal generator 24 and an alignment unit 26.

The input control signal generator 22 generates an input control signal pinb<0:2> for inputting the first and the second data Mux_ev<0:15> and Mux_od<0:15> to the pipe latch unit 30. The alignment unit 26 generates an alignment signal soseb_rd in order to classify the first and the second data Mux_ev<0:15> and Mux_od<0:15> according to a delay locked loop (DLL) falling clock signal and a DLL rising clock signal so that the first and the second data Mux_ev<0:15> and Mux_od<0:15> can be selectively synchronized with the DLL falling clock signal and the DLL rising clock signal. The output control signal generator 24 generates an output control signal poutb<0:2> for the pipe latch unit 30 to output the rising output data rdob and rdob_d and the falling output data fdob and fdob_d according to the CAS latency and the clock signal.

The output control unit 40 includes an output node control unit 44 and a DLL clock signal generator 42.

The output node control unit 44 generates an output node control signal outoff so that an output node of the output unit 50 can be stay in a high impedance (Hi-z) state. The DLL clock signal generator 42 generates a DLL rising clock signal rclk_do and a DLL falling clock signal fclk_do.

The output unit 50 includes an amplifier unit 52 and a driver unit 54.

The amplifier unit 52 amplifies the rising output data rdob and rdob_d and the falling output data fdob and fdob_d and outputs the amplified data in synchronization with the DLL rising clock signal rclk_do and the DLL falling clock signal fclk_do. The driver unit 54 drives an output signal of the amplifier unit 52.

Meanwhile, the pipe latch unit 30 includes a plurality of pipe latches connected in parallel. The first and the second data Mux_ev<0:15> and Mux_od<0:15> are originally outputted from a memory cell, and the outputted data from the memory cell are passed through a bit line sense amplifier (BLSA) 12, a sub hole 14, an input/output sense amplifier (IOSA) 16 and a selection unit 18. Herein, the bit line sense amplifier 12, the sub hole 14, the input/output sense amplifier 16 and the selection unit 18 are included in an internal data path 10.

Figure 2:
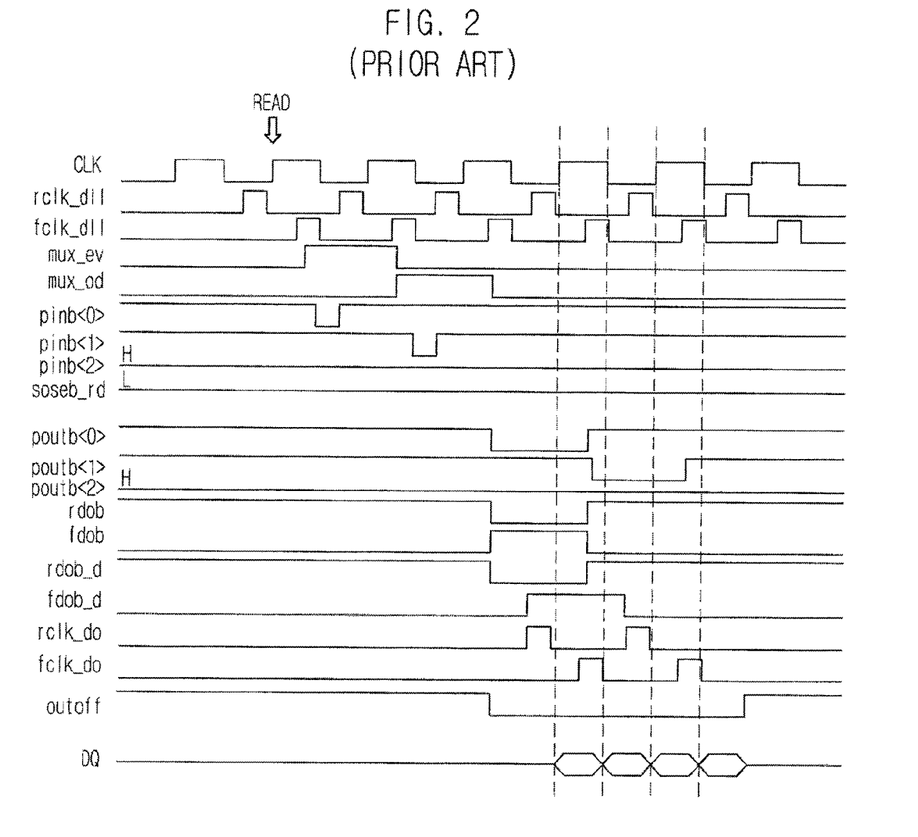
FIG. 2 is a timing diagram showing operations of a conventional semiconductor memory device shown in FIG. 1.

FIG. 2 is a timing diagram showing operations of the conventional semiconductor memory device shown in FIG. 1. Herein, it is assumed that a burst length is 4 and the CAS latency is 3.

Referring to FIG. 2, operations for outputting data from the memory cell to the data output pin DQ<0:15> are described below.

If a read command RD is inputted in synchronization with an external clock signal CLK, a data which corresponds to the read command RD is outputted as the first and the second data Mux_ev<0:15> and Mux_od<0:15> after being passed through the internal data path 10. The first and the second data Mux_ev<0:15> and Mux_od<0:15> is firstly latched by the pipe latch unit 30 when the input control signal pinb<0> is activated and the alignment signal soseb_rd is activated.

Thereafter, the first and the second data Mux_ev<0:15> and Mux_od<0:15> is secondly inputted, and the secondly inputted data is latched by the pipe latch unit 30 in response to the input control signal pinb<1> and the alignment signal soseb_rd. In response to the output control signal pout<0>, the firstly latched data of the pipe latch unit 30 is outputted from the pipe latch unit 30. Likewise, the secondly latched data of the pipe latch unit 30 is outputted from the pipe latch unit 30 in response to the output control signal pout<0>.

The rising output data rdob and rdob_d and the falling output data fdob and fdob_d outputted from the pipe latch unit 30 are amplified the amplifier unit 52 and are outputted to the data output pin DQ<0:15> respectively in synchronization with the rising DLL clock signal rclk_do and the falling DLL clock signal fclk_do.

As shown in FIG. 2, the data read operation is performed having the CAS latency of 3 and the burst length of 4.

However, since data is processed in synchronization with a clock signal and outputted satisfying the CAS latency in a double data rate (DDR) DRAM, it is hard to measure the tAA at a wafer level. Therefore, it is hard to perform a failure analysis at the wafer level.

SUMMARY OF INVENTION

It is, therefore, an object of the present invention to provide a semiconductor memory device capable of outputting data without being delayed to be synchronized with a clock signal and to satisfy a CAS latency so as to measure a data access time (tAA).

In accordance with an aspect of the present invention, there is provided a semiconductor memory device for measuring a data access time by controlling data output operation, including: a pipe latch control unit for generating an input control signal based on a test mode signal; a pipe latch unit for receiving data and controlling the data according to a CAS latency in synchronization with a clock signal at a normal mode or passing the data without synchronization with the clock signal at a test mode based on the input control signal;

an output control unit for generating an output node control signal based on the test mode signal; and an output unit for controlling an output data outputted from the pipe latch means according to the CAS latency in synchronization with the clock signal at the normal mode or passing the output data without synchronization with the clock signal at the test mode based on the output node control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 3:
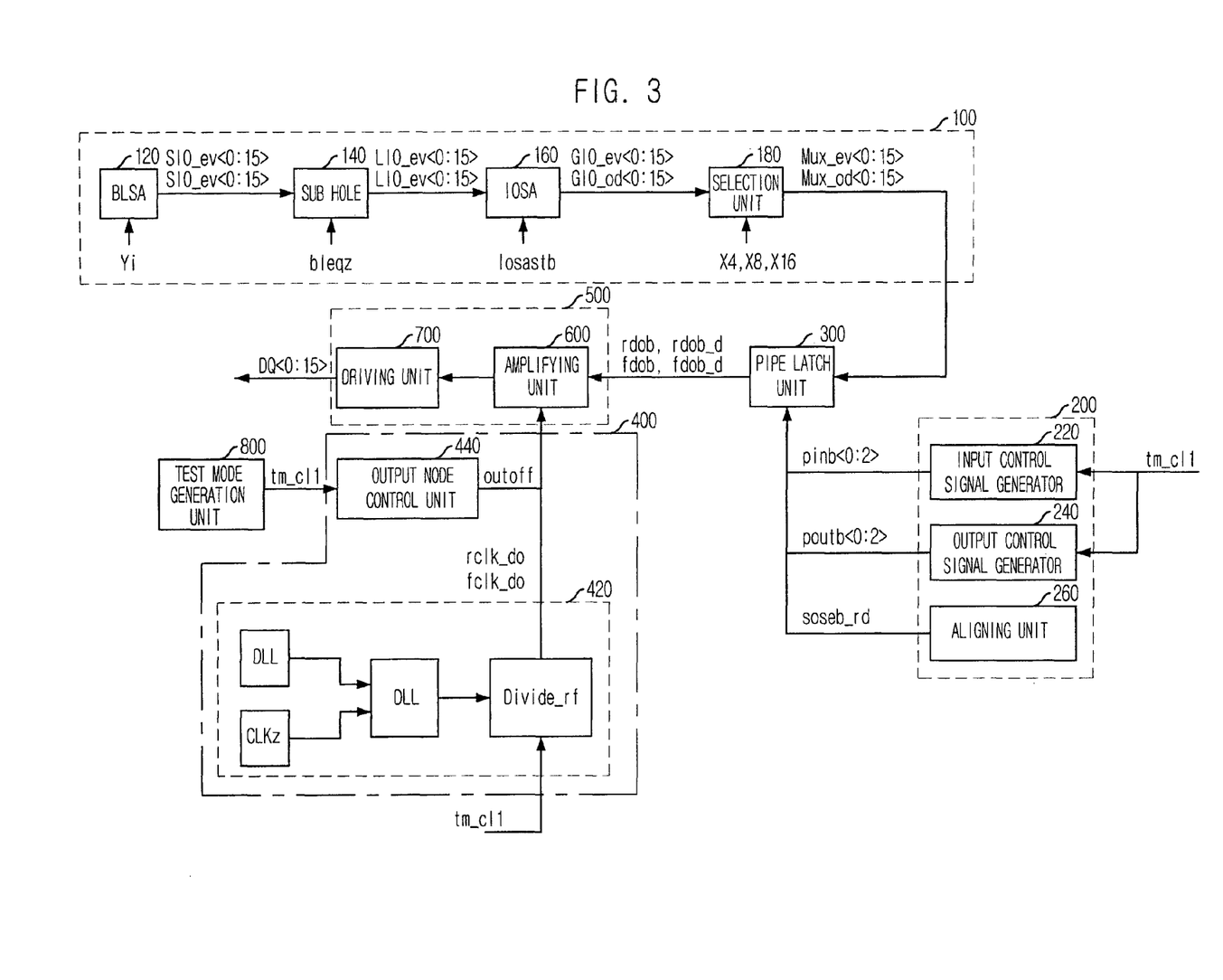
FIG. 3 is a block diagram showing a semiconductor memory device in accordance with a preferred embodiment of the present invention.

FIG. 3 is a block diagram showing a semiconductor memory device in accordance with a preferred embodiment of the present invention.

As shown, the semiconductor memory device includes a pipe latch unit 300, a pipe latch control unit 200, an output unit 500, an output control unit 400 and a test mode signal generation unit 800.

The pipe latch unit 300 receives a first and a second data Mux_ev<0:15> and Mux_od<0:15>. The pipe latch control unit 400 controls a data input/output operation of the pipe latch unit 300 according to a column address strobe (CAS) latency and a clock signal. The output unit 500 receives rising output data rdob and rdob_d and falling output data fdob and fdob_d outputted from the pipe latch unit 300 and outputs the received rising output data and the falling output data to data output pin DQ<0:15>. The output control unit 400 controls the data input/output operation of the output unit 400 according to a clock signal. The test mode signal generation unit 800 generates a test mode signal tm_cl1 for measuring an address access delay time (tAA).

The first and the second data Mux_ev<0:15> and Mux_od<0:15> is originally outputted from a memory cell, and the outputted data from the memory cell is passed through a bit line sense amplifier (BLSA) 120, a sub hole 140, an input/output sense amplifier (IOSA) 160 and a selection unit 180. The outputted data of the memory cell is amplified by the BLSA to be outputted as amplified data SIO_ev<0:15> and SIO_od<0:15> in response to a column selection signal Yi. The amplified data SIO_ev<0:15> and SIO_od<0:15> is outputted to a local data line by the sub hole 140. Local data LIO_ev<0:15> and LIO_od<0:15> is amplified by the input/output sense amplifier 160. The selection unit 180 receives an output signal of the input/output sense amplifier 160 to output the first and the second data Mux_ev<0:15> and Mux_od<0: 15> according to a bandwidth. Herein, the bit line sense amplifier 120, the sub hole 140, the input/output sense amplifier 160 and the selection unit 180 are included in an internal data path 100.

The pipe latch control unit 200 includes an input control signal generator 220, an output control signal generator 240 and an alignment unit 260.

The input control signal generator 220 generates an input control signal pinb<0:2> for inputting the first and the second data Mux_ev<0:15> and Mux_od<0:15> to the pipe latch unit 300. The alignment unit 260 generates an alignment signal soseb_rd in order to classify the first and the second data Mux_ev<0:15> and Mux_od<0:15> according to a delay locked loop (DLL) falling clock signal and a DLL rising clock signal so that the first and the second data Mux_ev<0:15> and Mux_od<0:15> can be selectively synchronized with the DLL falling clock signal and the DLL rising clock signal. The output control signal generator 240 generates an output control signal poutb<0:2> for the pipe latch unit 300 to output the rising output data rdob and rdob_d and the falling output data fdob and fdob_d according to the CAS latency and the clock signal.

The output control unit 400 includes an output node control unit 440 and a DLL clock signal generator 420.

The output node control unit 440 generates an output node control signal outoff so that an output node of the output unit 500 can be stay in a high impedance (Hi-z) state. The DLL clock signal generator 420 generates a DLL rising clock signal rclk_do and a DLL falling clock signal fclk_do.

The output unit 500 includes an amplifier unit 600 and a driver unit 700.

The amplifier unit 600 amplifies the rising output data rdob and rdob_d and the falling output data fdob and fdob_d and outputs the amplified data in synchronization with the DLL rising clock signal rclk_do and the DLL falling clock signal fclk_do. The driver unit 700 drives an output signal of the amplifier unit 600.

At a test mode, the test mode signal generation unit 800 generates the test mode signal tm_cl1 by decoding a signal inputted through a data pin or an address pin or by using a reserved field of a mode register set (MRS). Therefore, the test mode signal generation unit 800 can be embodied by using the MRS.

Meanwhile, the pipe latch unit 300 includes a plurality of pipe latches connected in parallel.

In accordance with the present invention, if the test mode signal tm_cl1 is activated, a ground voltage VSS is outputted as the input control signal pinb<0> and the output control signal poutb<0> so that one of the plurality of pipe latches, which receives the ground voltage, can be always activated. For the other pipe latches, a power supply voltage VDD is outputted as the input control signal pinb<0> and the output control signal poutb<0> so that the other pipe latches can be inactivated. The DLL clock signal generator 420 outputs the power supply voltage VDD as the DLL rising clock signal rclk_do and outputs the ground voltage VSS as the DLL falling clock signal fclk_do.

Therefore, during testing the tAA, the pipe latch unit 300 outputs data through the always activated latch under the control of the pipe latch control unit 200. Then, the data outputted from the pipe latch unit 300 is amplified and outputted by the amplifier unit 600 without being synchronized with a clock signal.

As a result, at the test mode, a data selected by a read command RD is outputted without being synchronized with a clock signal. Therefore, since the data is outputted having a delay time generated while the data is passed through the internal data path 100, the tAA can be measured at a wafer level.

Figure 4:
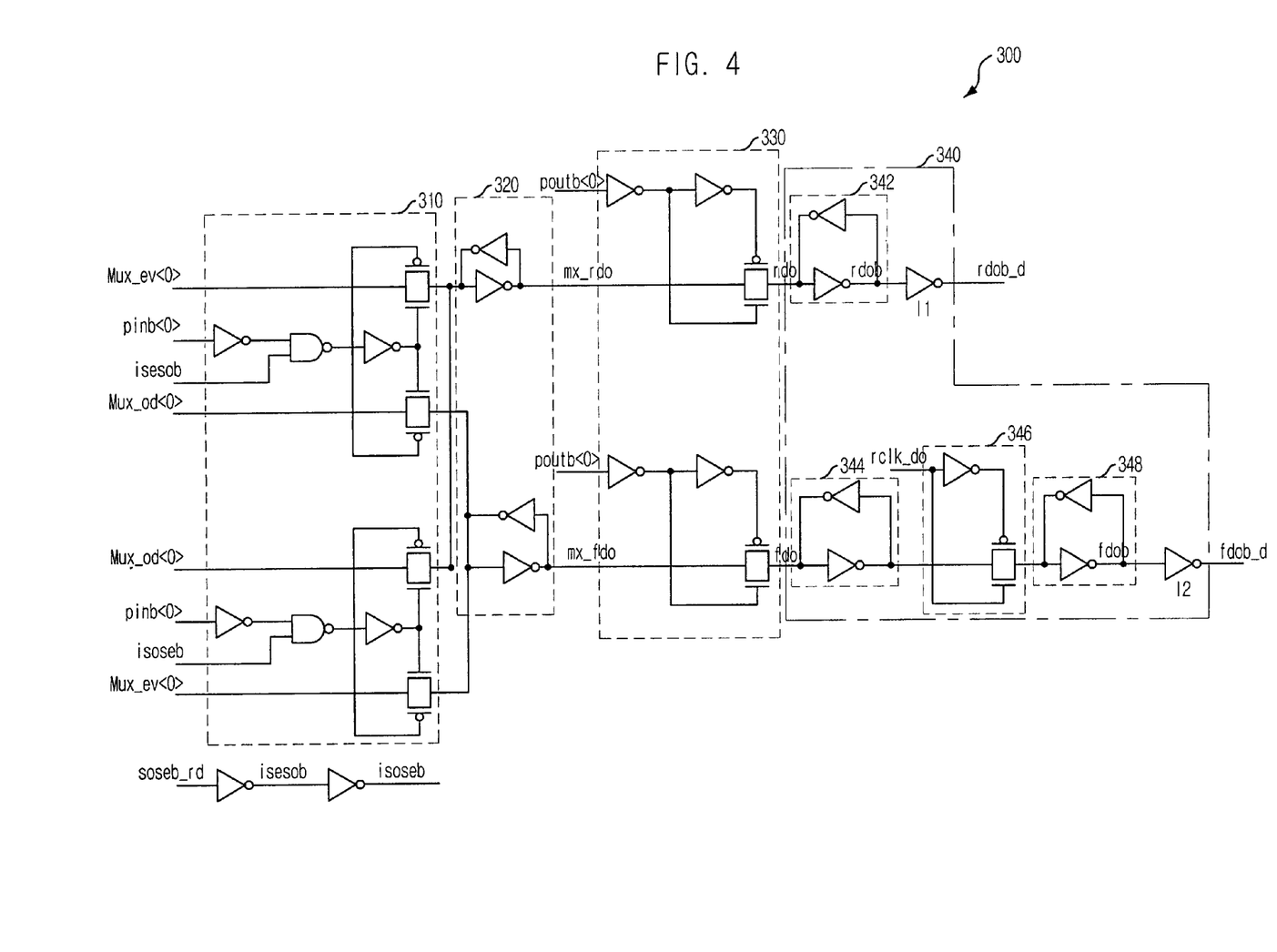
FIG. 4 is a schematic circuit diagram showing a pipe latch unit shown in FIG. 3.

FIG. 4 is a schematic circuit diagram showing the pipe latch unit 300 shown in FIG. 3.

As shown, the pipe latch unit 300 includes a selection unit 310, a latch unit 320, a transferring unit 330 and a pipe output unit 340.

The selection unit 310 classify the first and the second data Mux_ev<0:15> and Mux_od<0:15> according to the DLL falling clock signal fclk_do and the DLL rising clock signal rclk_do in response to the alignment signal soseb_rd so that the first and the second data Mux_ev<0:15> and Mux_od<0:15> can be selectively synchronized with the DLL falling clock signal fclk_do and the DLL rising clock signal rclk_do.

The latch unit 320 latches an output signal of the selection unit 310 to output a selected rising data mx_rdo and a selected falling data mx_fdo. The transferring gate 330 transfers the selected rising data mx_rdo and the selected falling data mx_fdo to the pipe output unit 340 in response to the output control signal poutb<0>. The selected rising data mx_rdo and the selected falling data mx_fdo are respectively outputted as a rising data rdo and a falling data fdo.

The pipe output unit 340 receives the rising data rdo and the falling data fdo in order to output the rising output data rdob and rdob_d and the falling output data fdob and fdob_d.

The pipe output unit 340 includes a first latch 342, a second latch 344, a transfer gate 346, a third latch 348, a first inverter I1 and a second inverter I2.

The first latch 342 latches the rising data rdo and outputs the rising output data rdob. The inverter I1 inverts the rising output data rdob to output the rising output data rdob_d. The second latch 344 latches the falling data fdo. The transfer gate 346 transfers the latched data of the second latch 344 to the third latch 348. Then, the third latch 348 receives an output signal of the transfer gate 346 to output the falling output data fdob. The second inverter I2 inverts the falling output data fdob to output the falling output data fdob_d.

Herein, although a single pipe latch is shown in FIG. 4, the pipe latch unit 300 includes a plurality of the pipe latches connected in parallel. The other pipe latches receives data in response to the input control signal pinb<1> or pinb<2> and outputs data in response to the output control signal poutb<1> or poutb<2>.

Meanwhile, if the test mode signal tm_cl1 is activated, the input control signals pinb<0> to pinb<2> are respectively outputted as the ground voltage VSS, the power supply voltage VDD and the power supply voltage VDD. Therefore, only a first pipe latch of the pipe latch unit 300 is enabled to latch data. Therefore, data outputted from the internal data path 100 is immediately latched by the pipe latch unit 300 without being synchronized with a clock signal. Since the output controls signals poutb<0> to poutb<2> are respectively outputted as the ground voltage VSS, the power supply voltage VDD and the power supply voltage VDD, the data latched by the pipe latch unit 300 is immediately outputted from the pipe latch unit 300 without being synchronized with a clock signal.

Therefore, when the test mode signal tm_cl1 is activated, one of the plurality of pipe latches included in the pipe latch unit 300 is enabled so that data outputted from the internal data path 100 can be received by and outputted from the pipe latch unit 300 without being delayed by the input control signal pinb<0:2>, the output control signal poutb<0:2> and the alignment signal soseb_rd.

Figure 5:
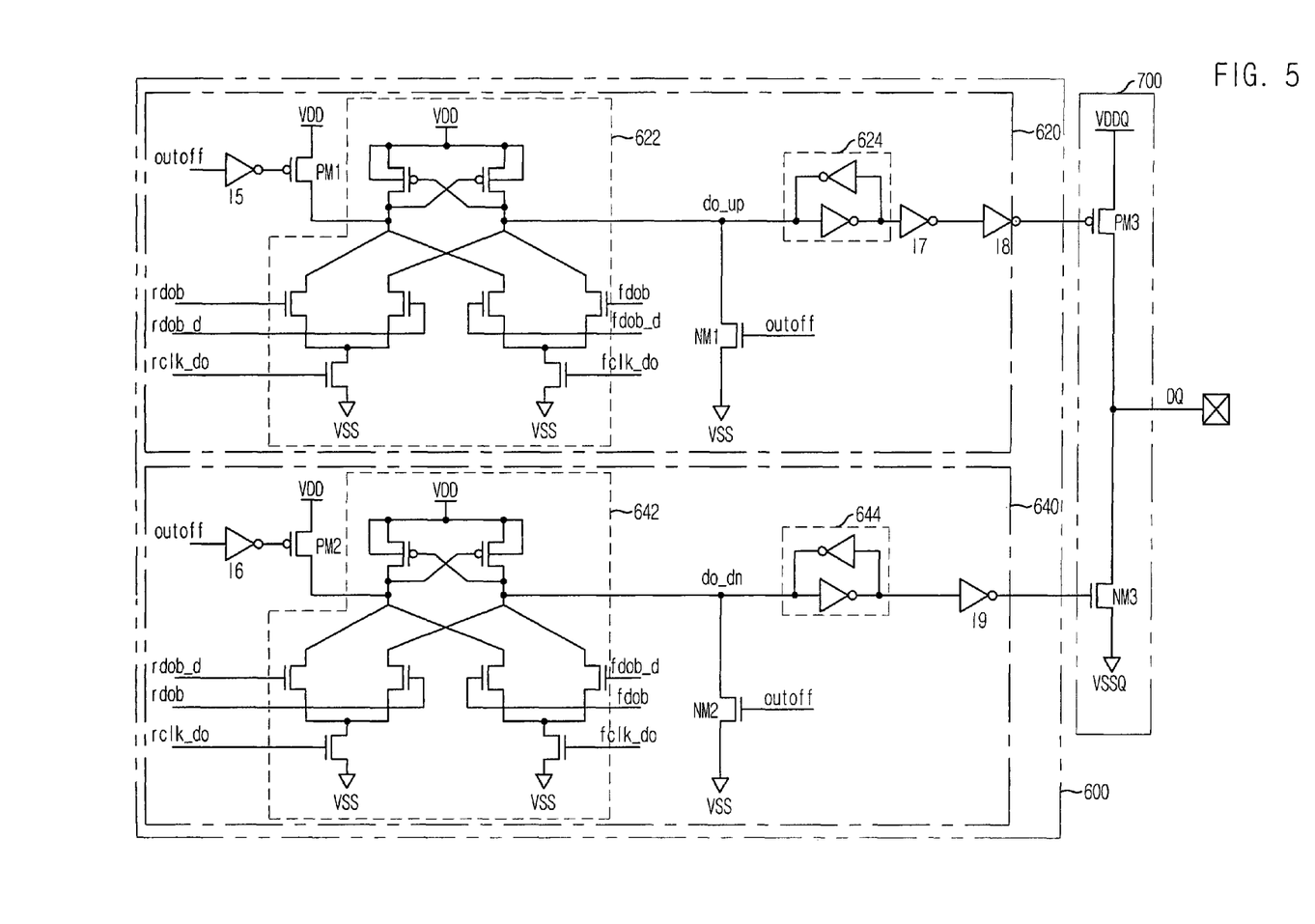
FIG. 5 is a schematic circuit diagram showing an amplifier unit and a driver unit shown in FIG. 3.

FIG. 5 is a schematic circuit diagram showing the amplifier unit 600 and a driver unit 700 shown in FIG. 3.

As shown, the amplifier unit 600 includes a high data amplifying unit 620 and a low data amplifying unit 640.

If the rising output data rdob and rdob_d and the falling output data fdob and fdob_d are in a logic high level, the high data amplifying unit 620 amplifies and outputs the rising output data rdob and rdob_d and the falling output data fdob and fdob_d in synchronization with the DLL rising clock signal rclk_do and the DLL falling clock signal fclk_do respectively. Likewise, if the rising output data rdob and rdob_d and the falling output data fdob and fdob_d are in a logic low level, the low data amplifying unit 640 amplifies and outputs the rising output data rdob and rdob_d and the falling output data fdob and fdob_d in synchronization with the DLL rising clock signal rclk_do and the DLL falling clock signal fclk_do respectively.

The driver unit 700 includes a p-type metal oxide semiconductor (PMOS) transistor PM3 and an n-type metal oxide semiconductor (NMOS) transistor NM3. The PMOS transistor PM3 is connected between a power supply voltage VDDQ and a data output pad (DQ pad), and a gate of the PMOS transistor PM3 receives an output signal of the high data amplifying unit 620. The NMOS transistor NM3 is connected between the DQ pad and a ground voltage VSSQ, and a gate of the NMOS transistor NM3 receives an output signal of the low data amplifying unit 640.

The high data amplifying unit 620 includes a differential amplifier 622, a first PMOS transistor PM1, a fourth latch 624 and inverters I7 and I8.

The differential amplifier 622 amplifies the rising output data rdob and rdob_d and the falling output data fdob and fdob_d in synchronization with the DLL rising clock signal rclk_do and the DLL falling clock signal fclk_do respectively.

The first PMOS transistor PM1 initializes an output node of the differential amplifier 622 and controls an output node of the amplifier unit 600 to stay in the high impedance state in response to the output node control signal outoff.

The fourth latch 624 latches an output signal of the differential amplifier 622. The inverters I7 and I8 delays an output signal of the fourth latch 624.

The low data amplifying unit 640 has the same structure with the high data amplifying unit 620.

Meanwhile, if the test mode signal tm_cl1 is activated, the DLL clock signal generator 420 outputs the DLL rising clock signal rclk_do as the power supply voltage VDD and outputs the DLL falling clock signal fclk_do as the ground voltage VSS. Therefore, since the differential amplifiers 622 and 642 controlled by the DLL falling clock signal rclk_do are always enabled, the amplifier unit 600 amplifies and outputs the rising output data rdob and rdob_d having a delay generated by only an internal circuit of the amplifier unit 600. Since the DLL falling clock signal fclk_do is always inactivated, the falling output data fdob and fdob_d is not outputted.

Figure 6:
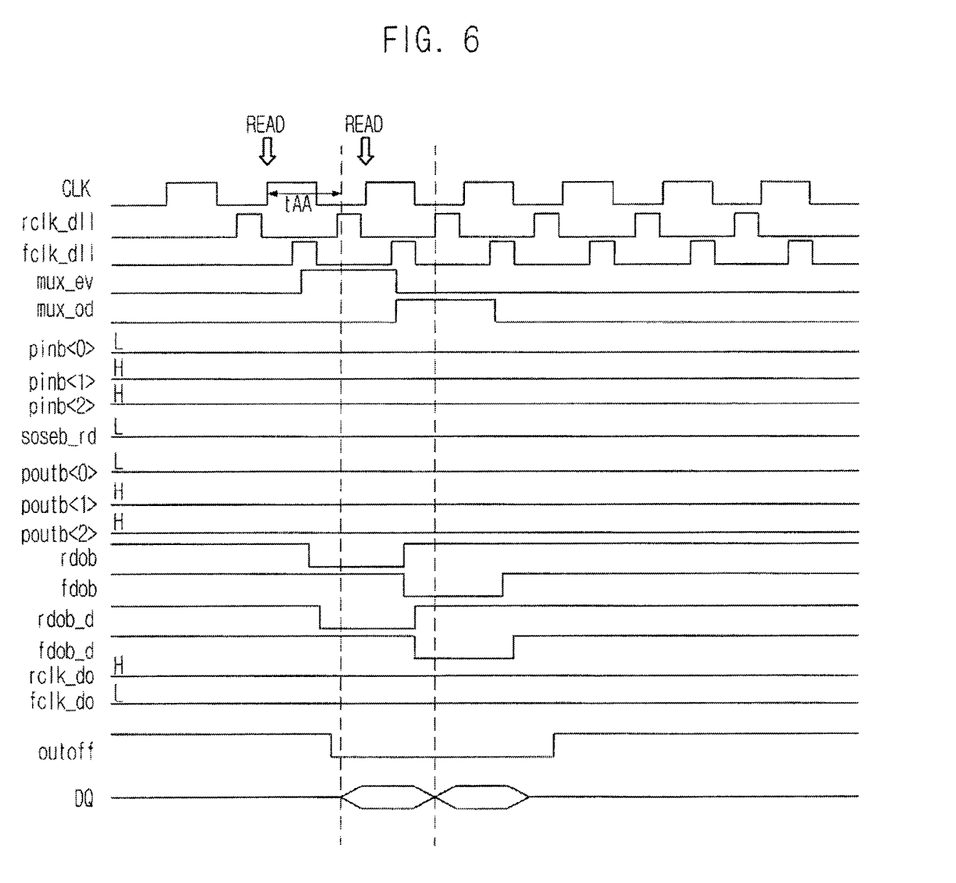
FIG. 6 is a timing diagram showing operations of an amplifier unit and a driver unit shown in FIG. 5.

FIG. 6 is a timing diagram showing operations of the amplifier unit 600 and a driver unit 700 shown in FIG. 5.

If the test mode signal tm_cl1 is activated, the input control signal generator 220 outputs the input control signals pinb<0>, pinb<1> and pinb<2> as a logic low level, a logic high level and a logic high level respectively. Likewise, the output control signal generator 240 outputs the output control signals poutb<0>, poutb<1> and poutb<2> as a logic low level, a logic high level and a logic high level respectively. The DLL clock signal generator 420 outputs the DLL rising clock signal rclk_do as a logic high level and outputs the DLL falling clock signal fclk_do as a logic low level so that the amplifier unit 600 can amplifies inputted data without being synchronized with the DLL rising and falling clock signals rclk_do and fclk_do. The output node control unit 440 inactivates the output node control signal outoff after a predetermined time is passed from a timing of activating the test mode signal tm_cl1 so that data can be inputted to an output node of the output unit 500.

Thereafter, if a read command RD is inputted in synchronization with the external clock signal CLK, a data of a memory cell selected by the read command RD is outputted as the first and the second data Mux_ev and Mux_od after traveling through the internal data path 100. Then, the first and the second data Mux_ev and Mux_od are passed through the pipe latch unit 300 without being delayed to be synchronized with a clock signal. Then, the first and the second data Mux_ev and Mux_od are outputted to the data output pin DQ<0:15> after being passed through the amplifier unit 600 and the driver unit 700.

Thereafter, in response to a consecutively inputted read command, a data is outputted as mentioned above.

Therefore, since a data is outputted without being delayed by a clock signal or the CAS latency, the tAA can be measured.

As a result, the tAA can be measured at the wafer level without controlling a period of a clock signal since the data is outputted having a delay time generated by only internal circuits which the data is passed through, i.e., the data is not delayed to be synchronized with the clock signal or to satisfy the CAS latency. Therefore, a test time for the tAA can be reduced, and a failure analysis is more easily performed at the wafer level.

The present application contains subject matter related to Korean patent application No. 2004-11094, filed in the Korean Patent Office on Feb. 19, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device for measuring a data access time by controlling data output operation, comprising:
   a test mode signal generation unit for generating a test mode signal in order to measure the data access time during a test mode measuring the data access time;
   a pipe latch control unit for generating an input control signal in response to the test mode signal;
   a pipe latch unit for outputting data from memory cells according to a column address strobe (CAS) latency in synchronization with a clock signal at a normal mode which is a data access mode and passing the data without synchronization with the clock signal at the test mode in response to the input control signal;
   an output control unit for generating an output node control signal based on the test mode signal; and
   an output unit for outputting data received from the pipe latch unit in response to a transition of a delay locked loop (DLL) clock signal at the normal mode and passing data received from the pipe latch unit in response to a predetermined logic level of the DLL clock signal wherein the output unit is enabled in response to the output node control signal;
   wherein the output control unit includes a DLL clock signal generator for outputting the DLL clock during the normal mode and outputting the DLL clock signal that maintains a constant level without oscillating as time elapses during the entire test mode to the output unit in response to the test mode signal during the test mode,
   wherein the output unit outputs the data received from the pipe latch unit without being synchronized with DLL rising and falling clock signals during the test mode.

2. The semiconductor memory device as recited in claim 1, wherein the pipe latch unit includes a plurality of latches connected in parallel, one of the plurality of latches being activated to output the data from the memory cells and the other pipe latches being inactivated in response to the input control signal during the test mode.

3. The semiconductor memory device as recited in claim 2, wherein the DLL clock signal generator generates so as to output a first data in synchronization with a falling clock of the DLL clock signal and output a second data in synchronization with a rising clock of the DLL clock signal at the normal mode.

4. The semiconductor memory device as recited in claim 3, the DLL clock signal generator controls the first data to be outputted without being synchronized with the rising clock of the DLL clock signal at the test mode.

5. The semiconductor memory device as recited in claim 1, wherein the output control unit includes an output node control unit so that an output node of the output unit can stay in a high impedance state according to the CAS latency at a normal mode, and the output node control unit controls the output node of the output unit to be in the high impedance state regardless of the CAS latency at the test mode.

6. The semiconductor memory device as recited in claim 1, wherein the test mode signal generation unit is a mode register set (MRS).

7. The semiconductor memory device as recited in claim 1, wherein the pipe latch unit includes a plurality of pipe latches connected to each other in parallel.

8. The semiconductor memory device as recited in claim 7, wherein the input control signal includes a plurality of control signals corresponding to each of the pipe latches.

9. The semiconductor memory device as recited in claim 8, wherein the pipe latch control unit concurrently outputs one of the control signals with a first logic voltage in order to activate corresponding pipe latch and the other control signals with a different logic voltage in response to the test mode signal during the test mode.

10. The semiconductor memory device as recited in claim 1, wherein the DLL clock signal generated during the normal mode oscillates between a high logic level and a low logic level and the DLL clock signal generated during the test mode has the predetermined logic level which has a constant logic level without oscillating as time elapses.

11. A semiconductor memory device for measuring a data access time by controlling data output operation, comprising:
   a test mode signal generation unit for generating a test mode signal in order to measure the data access time during a test mode set by a mode selection;
   a pipe latch control unit for generating an input control signal in response to the test mode signal;
   a pipe latch unit for passing the data without synchronization with the clock signal at the test mode in response to the input control signal;
   an output control unit for generating an output node control signal based on the test mode signal; and
   an output unit for passing data received from the pipe latch unit in response to a predetermined logic level of a delay locked loop (DLL) clock signal wherein the output unit is enabled in response to the output node control signal,
   wherein the output control unit includes a DLL clock signal generator for outputting the DLL clock signal that maintains a constant level without oscillating as time elapses during the entire test mode to the output unit in response to the test mode signal during the test mode so that the output unit outputs the data received from the pipe latch unit without being synchronized with DLL rising and falling clock signals during the test mode.

12. A semiconductor memory device for measuring a data access time by controlling data output operation, comprising:
   a pipe latch control unit configured to generate an input control signal in response to a test mode signal for measuring the data access time during a test mode;
   a pipe latch unit configured to receive a plurality of data from memory cells and the input control signal and to output the data received from the memory cells without synchronization with the clock signal during the test mode in response to the input control signal; and
   an output control unit configured to generate an output node control signal based on the test mode signal;
   an output unit configured to be enabled in response to the output node control signal and to pass data received from the pipe latch unit in response to a predetermined logic level of a delay locked loop (DLL) clock signal,
   wherein the output control unit includes a DLL clock signal generator configured to output the DLL clock signal that maintains a constant level without oscillating as time elapses during the entire test mode to the output unit in response to the test mode signal during the test mode.

13. The semiconductor memory device as recited in claim 12, further comprising:
   a test mode signal generation unit for generating the test mode signal in order to measure the data access time during the test mode measuring the data access time.

14. The semiconductor memory device as recited in claim 12, wherein the output unit outputs the data received from the pipe latch unit without being synchronized with DLL rising and falling clock signals during the test mode.

15. The semiconductor memory device as recited in claim 12, wherein the pipe latch unit includes a plurality of latches connected in parallel, the input control signal includes a plurality of control signals corresponding to each of the plurality of latches, and the pipe latch control unit concurrently outputs one of the control signals with a first logic voltage in order to activate corresponding pipe latch and the other control signals with a different logic voltage in response to the test mode signal during the test mode.

16. The semiconductor memory device as recited in claim 12, wherein the output control unit includes an output node control unit that controls the output node of the output unit to be in a high impedance state regardless of a column address strobe (CAS) latency during the test mode.

* * * * *